United States Patent
Inoue et al.

(10) Patent No.: US 7,138,689 B2
(45) Date of Patent: Nov. 21, 2006

(54) SEMICONDUCTOR DEVICE AND MANUFACTURING METHOD THEREOF

(75) Inventors: Tsuyoshi Inoue, Ibaraki (JP); Hiroshi Yamamoto, Ibaraki (JP); Mitsuru Yoshikawa, Ibaraki (JP); Saiki Hotate, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/740,232

(22) Filed: Dec. 18, 2003

(65) Prior Publication Data

US 2004/0150066 A1    Aug. 5, 2004

(30) Foreign Application Priority Data

Dec. 25, 2002    (JP) .............................. 2002-375027

(51) Int. Cl.
*H01L 29/78* (2006.01)
(52) U.S. Cl. .............................. 257/392; 257/E21.435; 257/408; 257/344; 257/500; 438/275
(58) Field of Classification Search ................ 257/344, 257/408, 392, 500, E21.435, 391; 438/230–232, 438/275, 276, 279
See application file for complete search history.

(56) References Cited

U.S. PATENT DOCUMENTS

| 5,091,763 A | * | 2/1992 | Sanchez ..................... 257/344 |
| 5,929,483 A | * | 7/1999 | Kim et al. .................. 257/336 |
| 6,348,719 B1 | * | 2/2002 | Chapman .................... 257/412 |

* cited by examiner

*Primary Examiner*—Kenneth Parker
*Assistant Examiner*—Matthew C. Landau
(74) *Attorney, Agent, or Firm*—Jacqueline J. Garner; W. James Brady, III; Frederick J. Telecky, Jr.

(57) ABSTRACT

A semiconductor substrate that has a MOS transistor with a high breakdown voltage having double sidewall insulation films and can inhibit negative effects on the electric characteristics and method thereof. The semiconductor device is formed as a transistor with a configuration having gate insulation film 21 and gate electrode 22 formed on semiconductor substrate 10, inner sidewall insulation film 25 formed at least on part of the gate insulation film and on both sides of the gate electrode, outer sidewall insulation film 26 formed at least on part of the gate insulation film and on both sides of the inner sidewall insulation film, low concentration impurity area 23 containing an impurity at a low concentration and formed in the semiconductor substrate in the area underneath the inner sidewall insulation film and the outer sidewall insulation film, and high concentration impurity area 27 containing an impurity at a concentration higher than the low concentration impurity area and formed in the semiconductor substrate in the area underneath both sides of the outer sidewall insulation film.

6 Claims, 11 Drawing Sheets

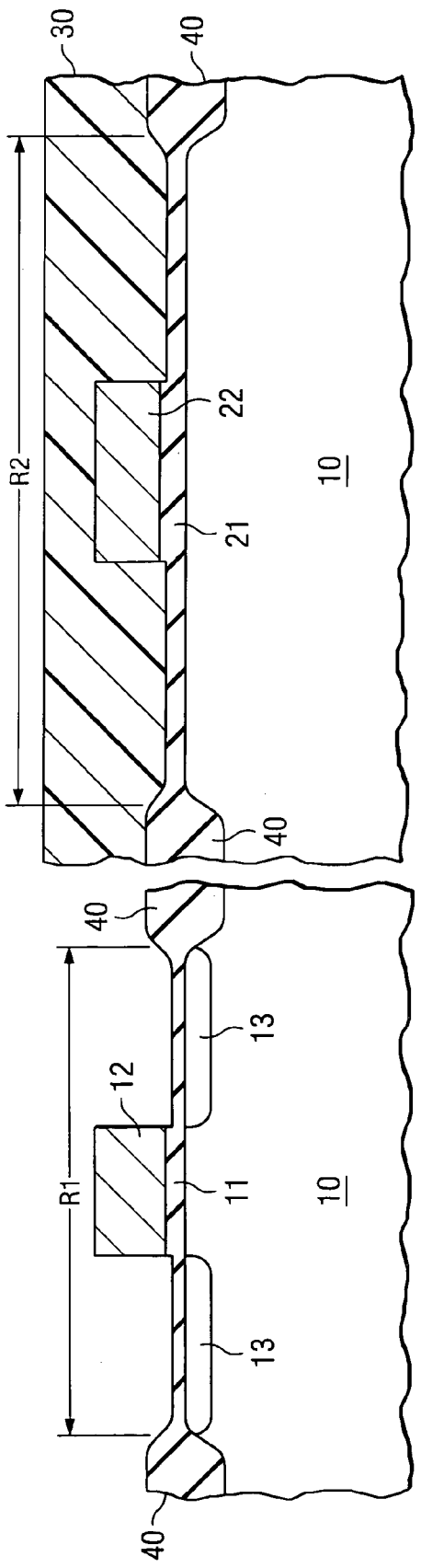
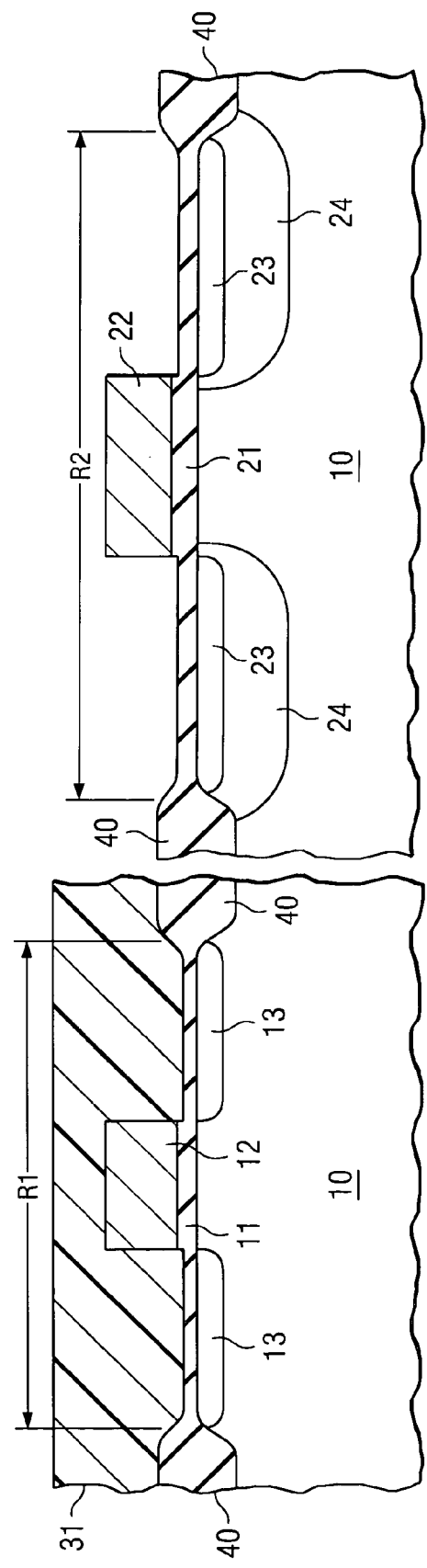
FIG. 4A
FIG. 4B

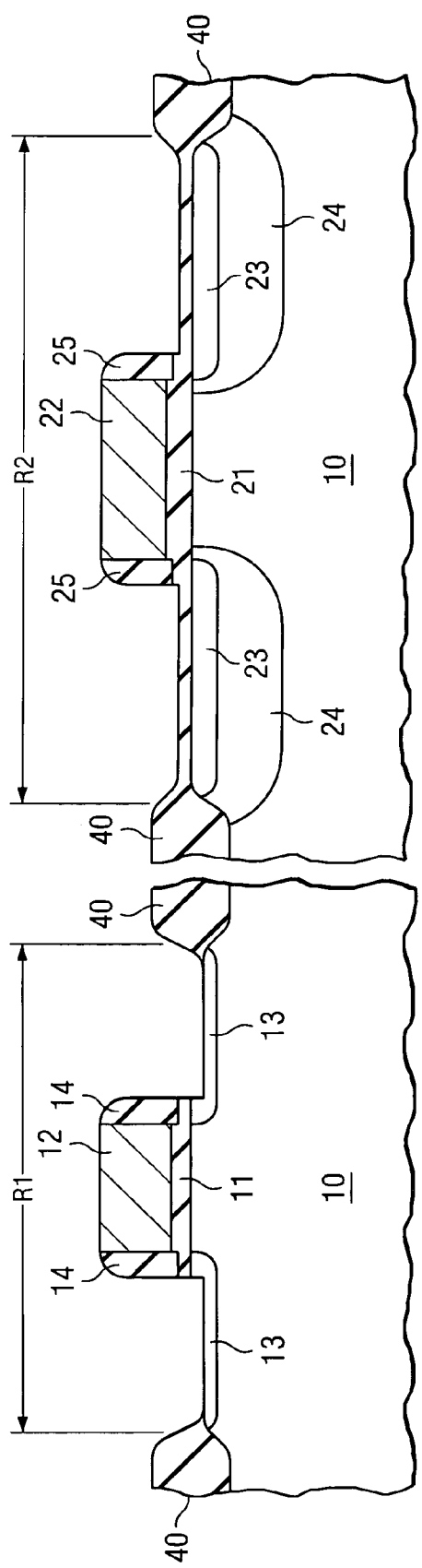
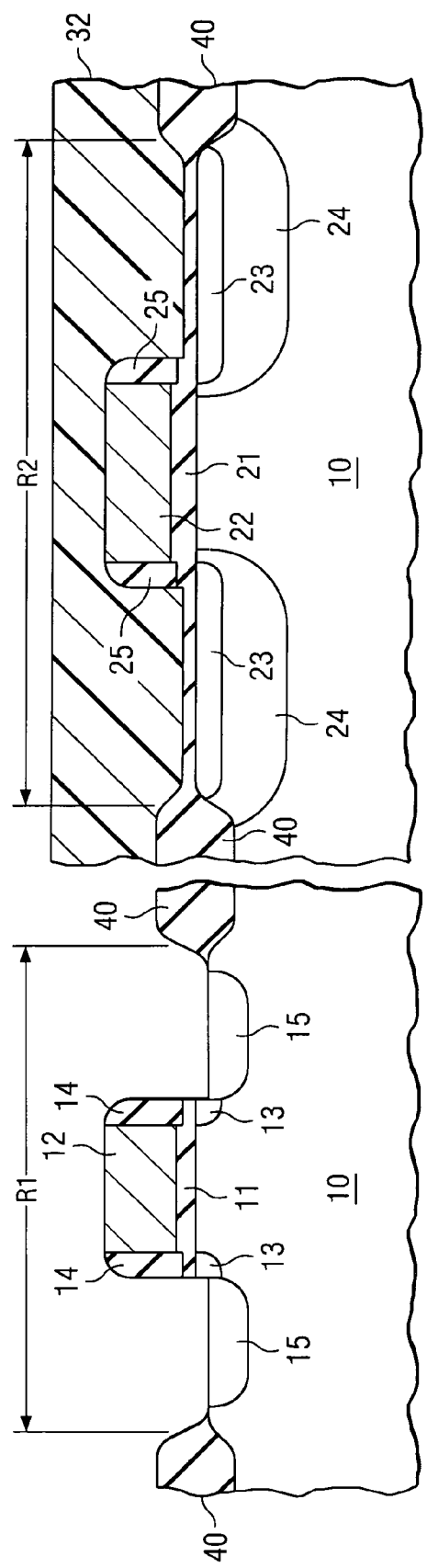
FIG. 5A
FIG. 5B

US 7,138,689 B2

SEMICONDUCTOR DEVICE AND MANUFACTURING METHOD THEREOF

FIELD OF THE INVENTION

The present invention pertains to a semiconductor device and the manufacturing method thereof. In particular, the present invention pertains to a semiconductor device having two types of field effect transistors with different breakdown voltages and the manufacturing method thereof.

BACKGROUND OF THE INVENTION

MOS (metal-oxide-semiconductor lamination) field effect transistors are widely used as basic components in semiconductor devices.

ICs (integrated circuits) with high breakdown voltages use MOS transistors with medium-high drive voltages, for example, about 10–20 V (referred to as MOS transistors with high breakdown voltages hereinafter).

A type of MOS transistor with a high breakdown voltage and double sidewall insulation films on both sides of the gate electrode has been proposed to achieve compatibility in the manufacturing process with MOS transistors with low drive voltages.

FIG. 12 is a cross-sectional view illustrating a semiconductor device of the aforementioned conventional example.

A first gate insulation film 111 made of silicon oxide is formed in an active area forming the first channel creation area of the p-type semiconductor substrate 110, which is partitioned by component separating insulation film 140. A first gate electrode 112 made of polysilicon is formed on this gate insulation film.

First inner sidewall insulation film 114 and first outer sidewall insulation film 116 made of silicon oxide are formed on both sides of the first gate electrode 112.

A first lightly doped area 113 containing an n-type impurity at a low concentration is formed adjacent to the first channel creation area in semiconductor substrate 110 in the area underneath the first inner sidewall insulation film 114.

A first high-concentration area 115 containing an n-type impurity at a high concentration is formed adjacent to the first lightly doped area 113 in semiconductor substrate 110 in the area underneath the first outer sidewall insulation film 116 and in the bordering area of the substrate.

In this way, a MOS transistor TR1 with a low drive voltage is formed.

In contrast, a second gate insulation film 121 made of silicon oxide is formed in an active area forming the second channel creation area of the p-type semiconductor substrate 110, which is partitioned by component separating insulation film 140. A second gate electrode 122 made of polysilicon is formed on this gate insulation film.

Second inner sidewall insulation film 125 and second outer sidewall insulation film 126 are formed on both sides of the second gate electrode 122.

A second lightly doped area 123 containing an n-type impurity at a low concentration is formed adjacent to the second channel creation area in semiconductor substrate 110 in the area underneath the second inner sidewall insulation film 125 and the second outer sidewall insulation film 126.

A second heavily doped area 127 containing an n-type impurity at a high concentration is formed adjacent to the second lightly doped area 123 in semiconductor substrate 110 in the area underneath the two sides of the second outer sidewall insulation film 126.

A third low-concentration area 124 containing an n-type impurity at a lower concentration than the second lightly doped area 123 is formed in such a way that it is deeper than the second lightly doped area 123 and the second heavily doped area 127 and it extends into the second channel creation area farther than the end of the second lightly doped area 123 on the side of the second channel creation area.

In this way, a MOS transistor TR2 with a high breakdown voltage and a medium-high drive voltage, for example, about 10–20 V is formed.

The aforementioned semiconductor device, for example, is manufactured as follows.

First, the first gate insulation film 111 is formed in the first transistor fabrication area having the first channel creation area on p-type semiconductor substrate 110 and the second gate insulation film 121 is formed in the second transistor fabrication area.

Then, the first gate electrode 112 is formed on the first gate insulation film 111 and the second gate electrode 122 is formed on the second gate insulation film 121.

Subsequently, a low concentration of n-type impurity ions is injected into the first transistor fabrication area with the first gate electrode 112 used as a mask to form the first lightly doped area 113.

Subsequently, n-type impurity ions are injected into the second transistor fabrication area with the second gate electrode 122 used as a mask to form the second lightly doped area 123. Also, the third low-concentration impurity 124 is formed by ions injected into the semiconductor substrate obliquely, for example, at an angle of 45°.

Subsequently, silicon oxide is deposited on the entire surface using, for example, the CVD method. Then, the entire surface is etched to form the first inner sidewall insulation film 114 on both sides of the first gate electrode 112 and to form the second inner sidewall insulation film 125 on both sides of the second gate electrode 122.

Subsequently, a high concentration of n-type impurity ions is injected into the first transistor fabrication area with the first inner sidewall insulation film 114 used as a mask to form the first heavily doped area 115.

Subsequently, silicon oxide is deposited on the entire surface using, for example, the CVD method. Then, the entire surface is etched to form the first outer sidewall insulation film 116 on both sides of the first inner sidewall insulation film 114 and to form the second outer sidewall insulation film 126 on both sides of the second inner sidewall insulation film 125.

Subsequently, n-type impurity ions are injected into the second transistor fabrication area with the second inner sidewall insulation film 125 and the second outer sidewall insulation film 126 used as a mask to form the second heavily doped area 127.

In this way, the semiconductor device with the configuration shown in FIG. 12 can be manufactured.

However, for MOS transistors with high breakdown voltages having double sidewall insulation films for compatibility in the manufacturing process with MOS transistors for low drive voltages during the etching performed to form the second inner sidewall insulation film 125 on both sides of the second gate electrode 122, the naked substrate is exposed or the surface layer of the substrate is removed. This has a negative effect on the electric characteristics, as described later.

This problem is common to n-channel type and p-channel type MOS transistors with high breakdown voltages.

First of all, when a positive drain voltage VD is applied, the gate voltage VG in the aforementioned MOS transistors with high breakdown voltages becomes 0 V and the drain leakage current becomes large.

FIG. 13(A) is a schematic cross-sectional view illustrating the expanded source-drain area. During the etching performed to form the second inner sidewall insulation film 125 on both sides of the second gate electrode 122, semiconductor substrate 110 is exposed or the surface layer is removed. As a result, regions with defects/contaminants DC are formed in the second lightly doped area 123 due to the introduction of lattice defects or contaminants.

FIG. 13(B) is a schematic diagram illustrating the energy band in the channel direction on the cross section shown in FIG. 13(A). It shows the conduction band Ec and valence band Ev of each area of the semiconductor substrate 10, the third lightly doped area 124, the second lightly doped area 123, and the second heavily doped area 127. Due to the formation of the regions with defects/contaminants DC in the second lightly doped area 123 as described above, an allowed energy state is formed in the forbidden band. This energy state becomes the recombination/generation center RGC. The recombination/generation center RGC becomes the medium for generation of electron-hole pairs. The number of electron-hole pairs increases exponentially compared with the case where there is no recombination/generation center RGC. The generated electrons e and holes h move in opposite directions due to the electric field in the depletion layer of the reverse biased second lightly doped area 123 and becomes a drift current, which is observed as the drain leakage current.

Exposure of the substrate or removal of the surface layer also occurs in the second heavily doped area 127, which leads to the formation of a region with defects/contaminants DC that becomes a recombination/generation center RGC. However, since the concentration of the impurity is very high, the electric field in the lateral direction in this area is very small, so there is no substantial contribution to the drain leakage current.

Second of all, if the aforementioned MOS transistors with high breakdown voltages are connected in series by the lightly doped areas of the transistors, the cutoff source voltage becomes low.

FIG. 14(A) is a cross-sectional view illustrating two MOS transistors (TR2a, TR2b) that have high breakdown voltages and that are connected in series by the lightly doped areas.

Each of the MOS transistors (TR2a, TR2b) with high breakdown voltages has the same configuration as MOS transistor TR2 with a high breakdown voltage shown in FIG. 12. However, the second heavily doped area is not formed in the region where the two MOS transistors (TR2a, TR2b) with high breakdown voltages are connected in series. There are only the second lightly doped area 123 and the third lightly doped area 124.

FIG. 14(B) shows the equivalent circuit of the configuration shown in FIG. 14(A). The MOS transistors (TR2a, TR2b) with high breakdown voltages are formed in the substrate B having a channel creation area and have gate electrodes (G1, G2), respectively. The heavily doped area of one MOS transistor TR2a with a high breakdown voltage becomes drain D, while the heavily doped area of the other MOS transistor TR2b with a high breakdown voltage becomes source S.

In the aforementioned configuration, when a high drain-substrate voltage VDB is applied, the drain current becomes small, and the apparent substrate effect becomes high. This is because the area with the highest impurity concentration in the surface layer of the second lightly doped area 123 in the region where the two MOS transistors (TR2a, TR2b) with high breakdown voltages are connected is removed by etching and becomes a high-resistance area. When the drain-substrate voltage VDB is further increased, the depletion layer V of the pn junction of the substrate—third lightly doped area reaches up to the surface of the substrate, and the drain junction enters the pinch off state. When the surface layer of the second lightly doped area 123 is removed, the drain has a stronger effect as the channel of a parasitic coupling field effect transistor PJ, which increases the drain resistance. As a result, the on current is reduced significantly for a lower source potential, and the cutoff source voltage decreases.

One task of the present invention is to solve the aforementioned problem by providing a semiconductor device, which has a MOS transistor with a high breakdown voltage and double sidewall insulation films for compatibility in the manufacturing process with a MOS transistor with a low drive voltage and which can inhibit increases in the drain leaking current, decreases in the cutoff source voltage, and other negative effects on the electric characteristics. Another task is to provide the manufacturing method of this semiconductor device.

SUMMARY OF THE INVENTION

In order to achieve the aforementioned tasks, the present invention provides a semiconductor device characterized by the following facts: the semiconductor device has a first transistor and a second transistor with different breakdown voltages. The second transistor comprises inner and outer sidewall insulation films both of which are formed, at least in part, on the gate insulation film.

Consequently, during the manufacturing process, after the etching performed to form the inner sidewall insulation film, the surface of the semiconductor substrate is not exposed in the area where the outer sidewall insulation film is formed, and no surface layer is removed. Therefore, no lattice defects or contaminants are introduced into the semiconductor device in the area underneath the outer sidewall insulation film, and no regions with defects/contaminants are formed in the lightly doped area of the second transistor. In other words, no recombination/generation center is formed so that negative effects on the electric characteristics, such as an increase of the drain leaking current, can be inhibited.

If MOS transistors with high breakdown voltages are connected in series by the lightly doped areas, since the surface layer of the second lightly doped area is not removed in the region where the two MOS transistors with high breakdown voltages are connected, the drain resistance can be prevented from increasing so that negative effects on the electric characteristics, such as a decrease of the cutoff source voltage, can be inhibited.

BRIEF DESCRIPTION OF THE DRAWINGS

FIGS. 4(A) and 4(B) are cross-sectional views illustrating the steps that follow the steps shown in FIG. 3.

FIGS. 5(A) and 5(B) are cross-sectional views illustrating the steps that follow the steps shown in FIG. 4.

REFERENCE NUMERALS AND SYMBOLS AS SHOWN IN THE DRAWINGS

In the figures, 10 represents a semiconductor substrate, 11 a first gate insulation film, 12 a first gate electrode, 13 a first low concentration impurity area, 14 a first inner sidewall insulation film, 15 a first high concentration impurity area, 16 a first outer sidewall insulation film, 21 a second gate insulation film, 22 a second gate electrode, 23 a second low concentration impurity area, 24 a third low concentration impurity area, 25 a second inner sidewall insulation film, 26 a second outer sidewall insulation film, 27 a second high concentration impurity area, 30, 31, 32, 33 a resist films, 40 a component separating insulation film, 110 a semiconductor substrate, 111 a first gate insulation film, 112 a first gate electrode, 113 a first low concentration impurity area, 114 a first inner sidewall insulation film, 115 a first high concentration impurity area, 116 a first outer sidewall insulation film, 121 a second gate insulation film, 122 a second gate electrode, 123 a second low concentration impurity area, 124 a third low concentration impurity area, 125 a second inner sidewall insulation film, 126 a second outer sidewall insulation film, 127 a second high concentration impurity area, 140 a component separating insulation film, R1 a first transistor fabrication area, R2 a second transistor fabrication area, TR1 a MOS transistor with low drive voltage (first transistor), TR2, TR2a, TR2b MOS transistors with high drive voltage (second transistor), VG a gate voltage, VS a source voltage, VDS a source-drain voltage, G, G1, G2 a gate, S a source, D a drain, B a substrate, V a depletion layer, ID a drain current, $ID_{LEAK}$ a drain leakage current, PJ a parasitic coupling field effect transistor, DC a region with defects/contaminants, and RGC a recombination/generation center.

DESCRIPTION OF THE EMBODIMENTS

In the following, the embodiments of the semiconductor device and its manufacturing method disclosed in the present invention will be explained with reference to the figures.

First Embodiment

Figure 1:
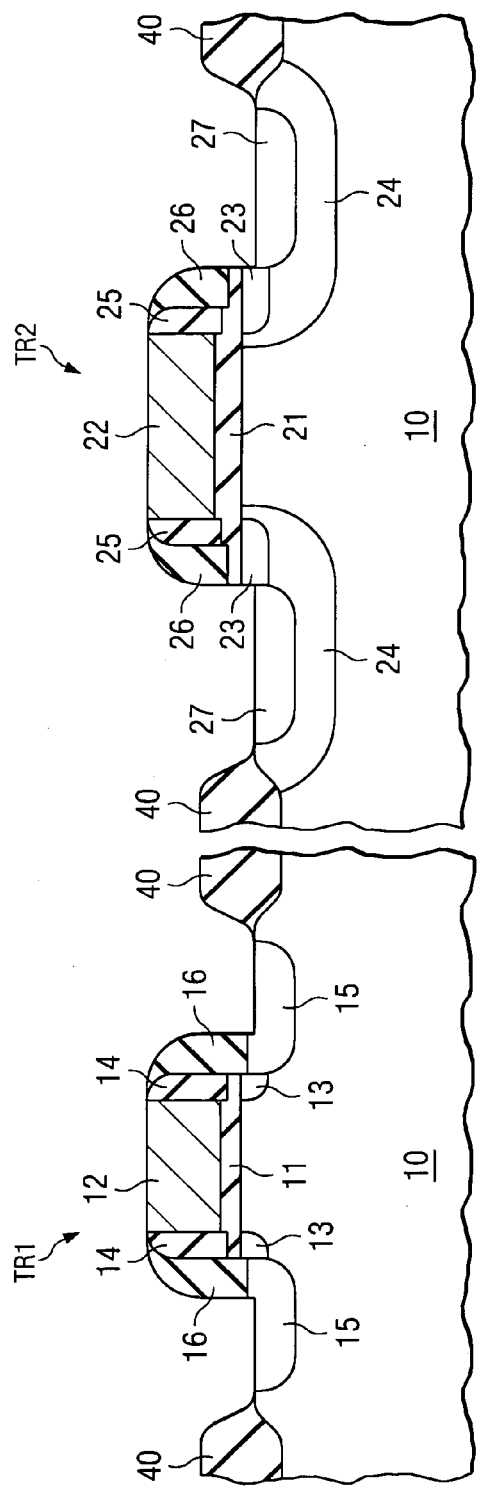
FIG. 1 is a cross-sectional view illustrating the semiconductor device disclosed in the first embodiment.

FIG. 1 is a cross-sectional view illustrating the semiconductor device disclosed in this embodiment.

The semiconductor device disclosed in this embodiment has a MOS transistor (first transistor) TR1 with a low drive voltage and a MOS transistor (second transistor) TR2 with a high drive voltage.

First gate insulation film 11 made of silicon oxide and having a thickness of about 5–10 nm is formed in an active area forming the first channel creation area of the p-type semiconductor substrate 10, which is partitioned by component separating insulation film 40 using the LOCOS method. First gate electrode 12 made of polysilicon is formed on this gate insulation film.

First inner sidewall insulation film 14 and first outer sidewall insulation film 16 are formed on both sides of the first gate electrode 12. These sidewall insulation films, for example, can be made of silicon oxide. The width of the first inner sidewall insulation film 14, for example, is 0.1 μm, and the width of the first outer sidewall insulation film 16, for example, is 0.5 μm.

In the area underneath the first inner sidewall insulation film 14 in semiconductor substrate 10, first lightly doped area 13 (also called LDD (lightly doped drain)) containing a low concentration of an n-type impurity is formed adjacent to the first channel creation area.

In the area underneath the first outer sidewall insulation film 16 and in adjacent areas in semiconductor substrate 10, first heavily doped area 15 (also called source-drain (SD) area) containing a high concentration of an n-type impurity is formed adjacent to the first lightly doped area 13.

In this way, a MOS transistor TR1 with a low drive voltage is formed.

On the other hand, second gate insulation film 21 made of silicon oxide and having a thickness of about 25–50 nm is formed in an active area forming the second channel creation area of p-type semiconductor substrate 10, which is partitioned by component separating insulation film 40. Second gate electrode 22 made of polysilicon is formed on this gate insulation film.

Second inner sidewall insulation film 25 and second outer sidewall insulation film 26 are formed at least on part of the second gate insulation film 21 and on both sides of the second gate electrode 22. The thickness of the second gate insulation film 21 in the area underneath the second outer sidewall insulation film 26 is smaller than the thickness of the second gate insulation film 21 in the area underneath the second gate electrode 22 and the second inner sidewall insulation film 25 by, for example, as much as the thickness of the first gate electrode 11.

The second inner sidewall insulation film 25 and the second outer sidewall insulation film 26, for example, are made of silicon oxide. The width of the second inner sidewall insulation film 25 is, for example, 0.1 μm, and the width of the second outer sidewall insulation film 26 is, for example, 0.5 μm.

In the area underneath the second inner sidewall insulation film 25 and the second outer sidewall insulation film 26 in semiconductor substrate 10, second lightly doped area 23

(also called LDD area) containing a low concentration of an n-type impurity is formed adjacent to the second channel creation area.

In the area in semiconductor substrate (10) underneath both sides of the second outer sidewall insulation film 26, second heavily doped area 27 (also called source-drain area) containing a high concentration of an n-type impurity is formed adjacent to the second lightly doped area 23.

In addition, third lightly doped area 24 (also called DDD (double diffused drain) area) containing a lower concentration of an n-type impurity than the second lightly doped area 23 is formed in such a way that it is deeper than the second lightly doped area 23 and the second heavily doped area 27 and it extends into the second channel creation area farther than the end of the second lightly doped area 23 on the side of the second channel creation area.

In this way, a MOS transistor TR2 with a high breakdown voltage and a medium-high drive voltage, for example, 10–20 V, is formed.

Figure 2B:
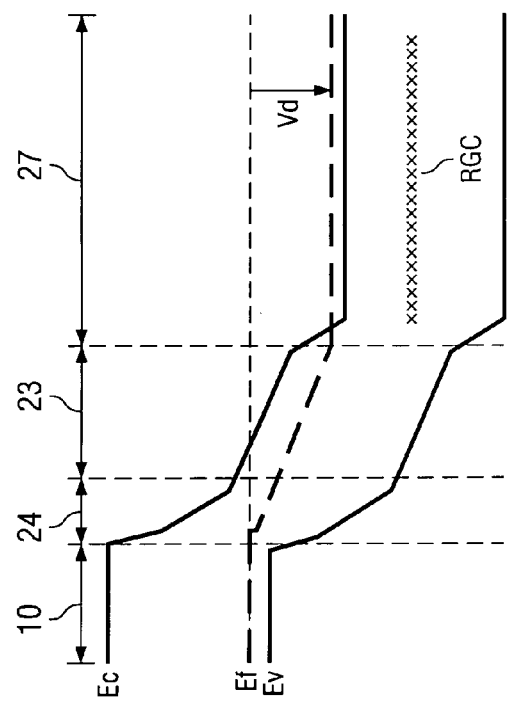
FIG. 2(B) is a schematic diagram illustrating the energy band in the channel direction of the cross section shown in FIG. 2(A).
Figure 2A:
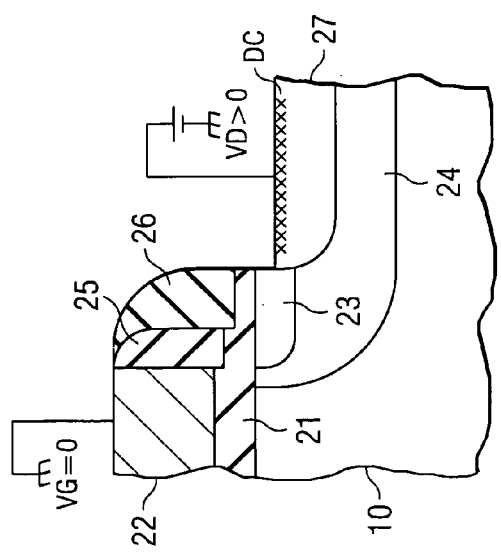
FIG. 2(A) is a schematic cross-sectional view illustrating the expanded source-drain area in the MOS transistor with a high breakdown voltage disclosed in the first embodiment.

FIG. 2(A) is a schematic cross-sectional view illustrating the expanded source-drain area of MOS transistor TR2 with a high breakdown voltage disclosed in the present embodiment.

The second inner sidewall insulation film 25 and the second outer sidewall insulation film 26 are formed at least on part of the second gate insulation film 21.

Consequently, during the manufacturing process, after the etching performed to form the second inner sidewall insulation film 25, the surface of semiconductor substrate 10 will not be exposed and the surface layer will not be removed in the area where the second outer sidewall insulation film 26 is formed. Therefore, no lattice defects or contamination will occur in that area, and there will be no regions with defects/contaminants DC in the second lightly doped area 23.

FIG. 2(B) is a schematic diagram illustrating the energy band in the channel direction of the cross section shown in FIG. 2(A). It shows the conduction band Ec and the valence band Ev of semiconductor substrate (10), the third lightly doped area 24, the second lightly doped area 23, and the second heavily doped area 27. Since there is no allowed energy state acting as a recombination/generation center RGC in the forbidden band in the second lightly doped area 23 formed as described above, the drain leaking current can be inhibited.

Although regions with defects/contaminants DC are formed in the second heavily doped area, which creates a recombination/generation center RGC, since the concentration of the impurity is very high, the electric field in the lateral direction in this area is very small, so that there is no substantial contribution to the drain leaking current.

In the semiconductor device disclosed in the aforementioned embodiment, in the MOS transistor TR2 with a high breakdown voltage, the second inner sidewall insulation film 25 and the second outer sidewall insulation film 26 are formed at least on part of the second gate insulation film 21. Therefore, no lattice defects or contamination will be introduced into semiconductor substrate 10 in the area underneath the second outer sidewall insulation film 26, and no regions with defects/contaminants are formed in the second lightly doped area 23. In other words, no recombination/generation center will be formed, and thus the increase of the drain leaking current as a negative effect on the electric characteristics can be inhibited.

In the following, the method for manufacturing the semiconductor device disclosed in the present invention will be explained.

Figure 3A:
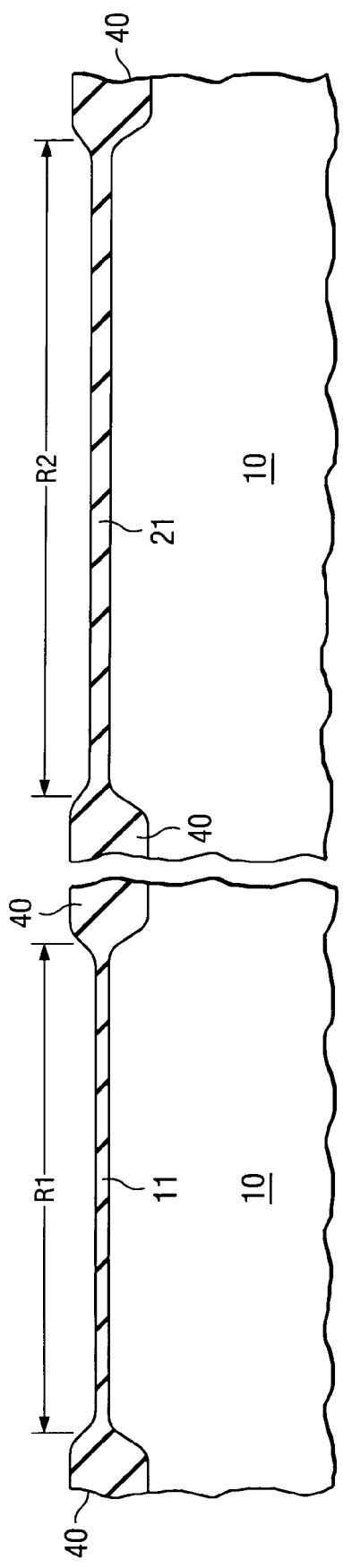
FIGS. 3(A) and 3(B) are cross-sectional views illustrating the steps of the method for manufacturing the semiconductor device disclosed in the first embodiment.

First, as shown in FIG. 3(A), on p-type silicon semiconductor substrate 10 having a first channel creation area in first transistor fabrication area R1 and a second channel creation area in second transistor fabrication area R2, first gate insulation film 11 with a thickness of about 5–10 nm is formed using the hot oxidation method in the first transistor fabrication area R1, and second gate insulation film 21 with a thickness of about 25–50 nm is formed in the second transistor fabrication area R2.

Figure 3B:
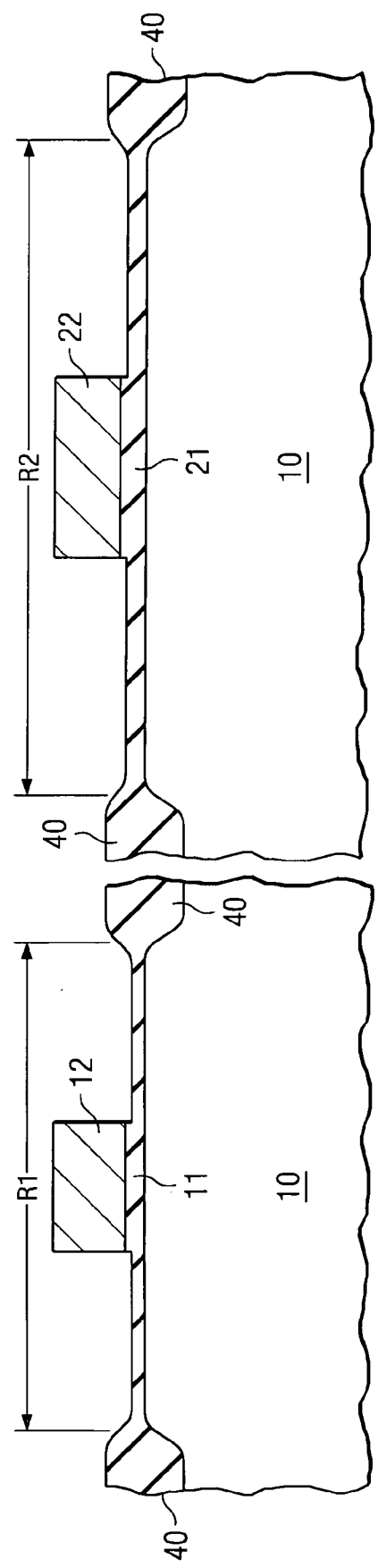

Subsequently, as shown in FIG. 3(B), polysilicon is deposited using the CVD (chemical vapor deposition) method, and a resist film with a gate electrode pattern is formed by means of photolithography. Then, an etching operation, such as RIE (reactive ion etching), is performed to produce the pattern of the gate electrode shape to form the first gate electrode 12 on the first gate insulation film 11 in the first transistor fabrication area R1 and to form the second gate electrode 22 on the second gate insulation film 21 in the second transistor fabrication area R2.

As a result of over etching to form the gate electrodes, the first gate insulation film 11 and the second gate insulation film 21 are made somewhat thinner except for the area underneath the gate electrodes.

Subsequently, as shown in FIG. 4(A), with the second transistor fabrication area R2 protected by resist film 30, a low concentration of n-type impurity ions is injected into the first transistor fabrication area R1 with the first gate electrode 12 used as a mask to form the first lightly doped area 13.

Subsequently, as shown in FIG. 4(B), with the first transistor fabrication area R1 protected by resist film 31, a low concentration of n-type impurity ions is injected into the second transistor fabrication area R2 with the second gate electrode 22 used as a mask to form the second lightly doped area 23.

Also, with the second gate electrode 22 used as a mask, n-type impurity ions are injected at an angle of 45° into the semiconductor substrate to form third lightly doped area 24 which has a lower concentration than the second lightly doped area 23 and which is deeper than the second lightly doped area 23 and which extends into the second channel creation area farther than the end of the second lightly doped area 23 on the side of the second channel creation area.

In the case when the impurity concentrations in the first lightly doped area 13 and the second lightly doped area 23 can be set equal to each other, the impurity ions can also be injected simultaneously into the first transistor fabrication area R1 and the second transistor fabrication area R2 to form the first lightly doped area 13 and the second lightly doped area 23 at the same time instead of injecting the impurity ions while protecting the first transistor fabrication area R1 and the second transistor fabrication area R2 alternately as described above.

Subsequently, as shown in FIG. 5(A), silicon oxide is deposited on the entire surface using the CVD method and is then etched back over the entire surface except for the areas with silicon oxide on both sides of the first gate electrode 12 and the second gate electrode 22. In this way, first inner sidewall insulation film 14 is formed on both sides of the first gate electrode 12 in the first transistor fabrication area R1, and second inner sidewall insulation film 25 is formed at least on part of the second gate insulation film 21 and on both sides of the second gate electrode 22 in the second transistor fabrication area R2.

In this case, since the first inner sidewall insulation film 14 and the second inner sidewall insulation film 25 are formed to a width of about 0.1 μm, the thickness of the deposited silicon oxide is set to about 0.1 μm.

In this case, the etch back operation performed for forming the first inner sidewall insulation film 14 and the second inner sidewall insulation film 25 ends at a time when at least part of the second gate insulation film 21 remains on both sides of the second inner sidewall insulation film 25 and the first gate insulation film 11 is completely removed from both sides of the first inner sidewall insulation film 14.

For example, when the first gate insulation film 11 is completely removed on both sides of the first inner sidewall insulation film 14 in the first transistor fabrication area, since the surface of the silicon substrate is exposed, the end of the etch back process can be determined by detecting light emitted by silicon in the plasma.

Consequently, the second gate insulation film 21 on the sides of the second inner sidewall insulation film 25 is thinner than the second gate insulation film 21 underneath the second gate electrode 22 and the second inner sidewall insulation film 25 by as much as the thickness of the first gate electrode 11.

Subsequently, as shown in FIG. 5(B), with the second transistor fabrication area R2 protected by resist film 32, a high concentration of n-type impurity ions is injected into the first transistor fabrication area R1 with the first inner sidewall insulation film 14 used as a mask to form the first heavily doped area 15.

Figure 6A:
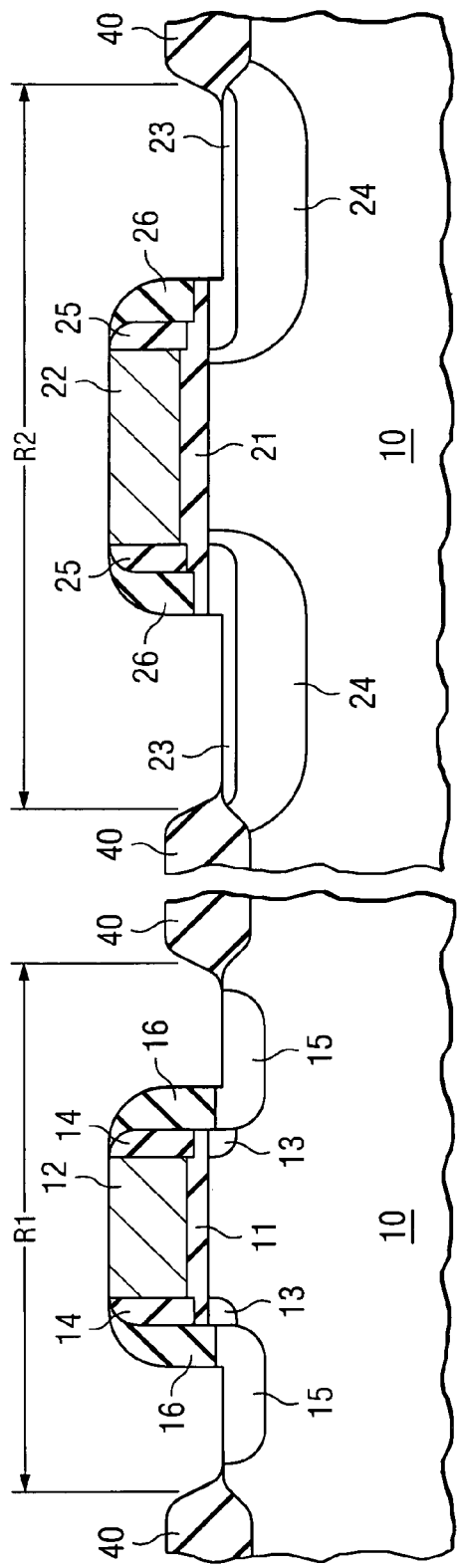
FIGS. 6(A) and 6(B) are cross-sectional views illustrating the steps that follow the steps shown in FIG. 5.

Subsequently, as shown in FIG. 6(A), silicon oxide is deposited by the CVD method on the entire surface and is then etched back over the entire surface except for the areas with silicon oxide on both sides of the first inner sidewall insulation film 14 and the second inner sidewall insulation film 25 to form first outer sidewall insulation film 16 on both sides of the first inner sidewall insulation film 14 in the first transistor fabrication area R1 and to form the second outer sidewall insulation film 26 at least on part of the second gate insulation film 21 and on both sides of the second inner sidewall insulation film 25 in the second transistor fabrication area R2. On both sides of the second inner sidewall insulation film 25, the second gate insulted film 21 is made thinner as described above, and the second outer sidewall insulation film 26 is formed on it.

In this case, for example, since the first outer sidewall insulation film 16 and the second outer sidewall insulation film 26 are formed to a width of about 0.5 μm, the thickness of the deposited silicon oxide is set to about 0.5 μm.

The etch back operation ends at the time when the surface of semiconductor substrate 10 is exposed on both sides of the first outer sidewall insulation film 14 and on both sides of the second outer sidewall insulation film 26. As a result of the over etching, the surface of semiconductor substrate 10 is etched to a certain extent on both sides of the first sidewall insulation film 14 and on both sides of the second outer sidewall insulation film 26.

Figure 6B:
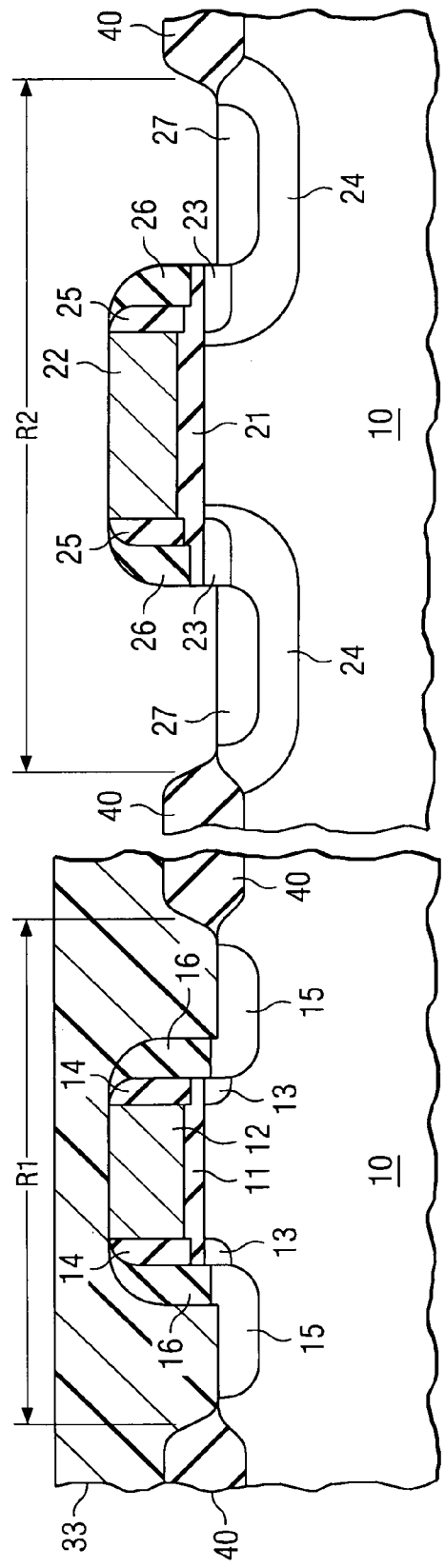

Subsequently, as shown in FIG. 6(B), with the first transistor fabrication area R1 protected by resist film 33, a high concentration of n-type impurity ions is injected into the second transistor fabrication area R2 with the second inner sidewall insulation film 25 and the second outer sidewall insulation film 26 used as a mask to form the second high concentration impurity area 27.

In this way, the semiconductor device with the configuration shown in FIG. 1 is obtained.

During manufacturing of a semiconductor device having a first transistor and a second transistor with different breakdown voltages using the aforementioned semiconductor device manufacturing method, when the second inner sidewall insulation film is formed on both sides of the second gate electrode, the sidewall insulation film is formed at least on part of the second gate insulation film. When the second outer sidewall insulation film is formed on both sides of the second inner sidewall insulation film, the sidewall insulation film is also formed at least on part of the second gate insulation film.

Consequently, as described above, since the semiconductor substrate is not exposed and the surface layer is not removed after the etching performed to form the second inner sidewall insulation film in the second transistor fabrication area, an increase of the drain leaking current, which negatively affects the electric characteristics, can be inhibited.

Second Embodiment

Figure 7:
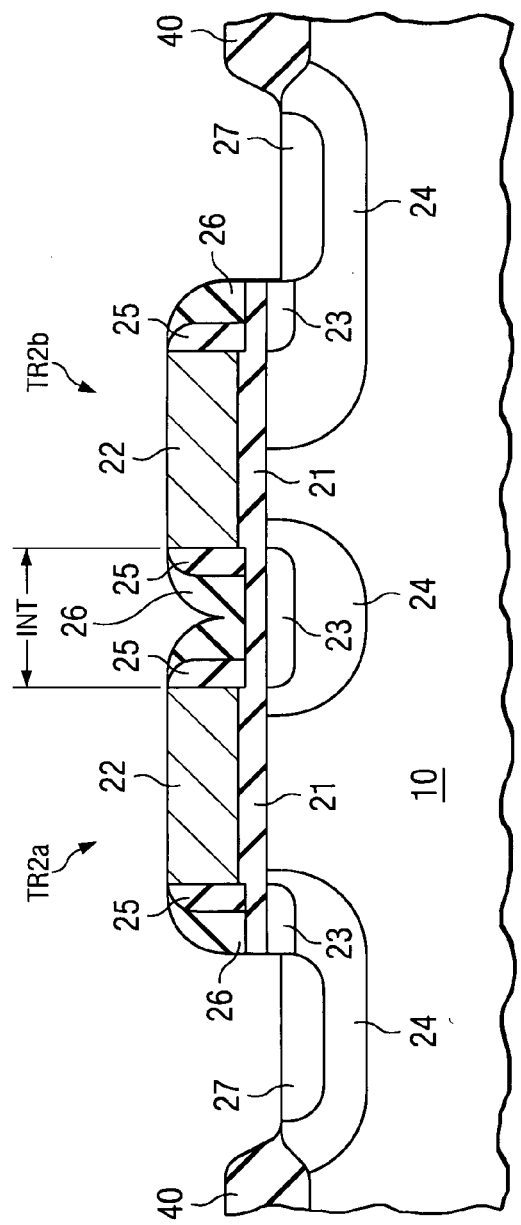
FIG. 7 is a cross-sectional view illustrating the semiconductor device disclosed in the second embodiment.

In the semiconductor device disclosed in this embodiment, two MOS transistors (TR2a, TR2b) with high breakdown voltages having the same configuration as the MOS transistor with high breakdown voltage disclosed in the first embodiment are connected in series by the lightly doped areas. FIG. 7 shows its cross section.

Each of the MOS transistors (TR2a, TR2b) with high breakdown voltages has the same configuration as the MOS transistor TR2 with a high breakdown voltage shown in FIG. 1. However, the interval INT between the two gate electrodes 22 of the two transistors is reduced to about 0.5 μm. Consequently, the second high concentration impurity area is not formed in the part where the two MOS transistors (TR2a, TR2b) with high breakdown voltages are connected in series. Only the second low concentration impurity area 23 and the third low concentration impurity area 24 are formed.

In the aforementioned semiconductor device of the present invention, the second inner sidewall insulation film and the second outer sidewall insulation film are formed at least on part of the second gate insulation film. The part with the highest impurity concentration in the surface layers of the second low concentration impurity area 23 and the third low concentration impurity area 24 in the region where the two MOS transistors (TR2a, TR2b) are connected is not removed by means of etching, and the high-concentration parts in the second low concentration impurity area 23 and the third low concentration impurity area 24 remain unchanged. Therefore, the depletion layer can be prevented from expanding, and the parasitic coupling field effect transistor PJ in the drain part is difficult to pinch off.

Consequently, an increase of the drain resistance can be prevented. A decrease of the cutoff source voltage, which negatively affects the electric characteristics, can be inhibited.

The semiconductor device disclosed in the present embodiment can be formed in the same way as described in the first embodiment.

However, since the interval INT between the two gate electrodes 22 of the MOS transistors (TR2a, TR2b) is reduced to about 0.5 μm and the second inner sidewall insulation film 25 and the second outer sidewall insulation film 26 are formed in this interval, the second high concentration impurity area is not formed in the region where the two MOS transistors (TR2a, TR2b) are connected in series during the step for forming the second high concentration impurity area.

EMBODIMENT EXAMPLE 1

The drain leaking current was measured for the MOS transistor with a high breakdown voltage disclosed in the first embodiment.

Figure 8A:
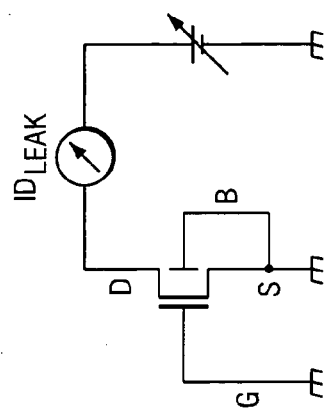
FIG. 8(A) shows the equivalent circuit of the measuring device used in Embodiment Example 1.

FIG. 8(A) shows the equivalent circuit of the measuring device. The voltage on gate G, substrate B, and source S was kept at 0 V, while the drain voltage VD applied to drain D was varied.

Figure 8B:
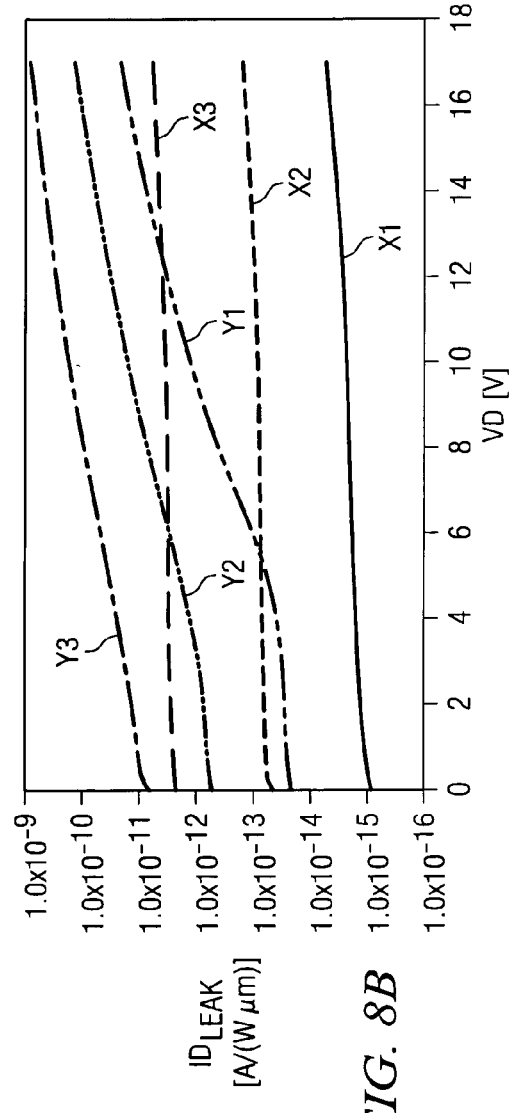
FIG. 8(B) shows the measurement results.

FIG. 8(B) shows the results of the aforementioned measurement. The abscissa represents the drain voltage VD and the ordinate axis represents the drain leaking current $ID_{LEAK}$. The figure shows the results measured at X1 (measurement temperature: 25° C.), X2 (measurement temperature: 75° C.), and X3 (measurement temperature: 125° C.).

For comparison, a conventional MOS transistor with high breakdown voltage was manufactured, and the drain leaking current was measured in the same way. The results are shown in FIG. 8(B). The figure shows the results measured at Y1 (measurement temperature: 25° C.), Y2 (measurement temperature: 75° C.), and Y3 (measurement temperature: 125° C.).

As can be seen from FIG. 8(B), compared with the conventional example, the n-channel type MOS transistor with a high breakdown voltage disclosed in the present invention can reduce the drain leaking current by three orders of magnitude at room temperature (25° C.) and drain voltage VD=16.5 V.

Also, a p-channel type MOS transistor with a high breakdown voltage having the same configuration as that described in the first embodiment was manufactured, and the drain leaking current was measured.

Figure 9A:
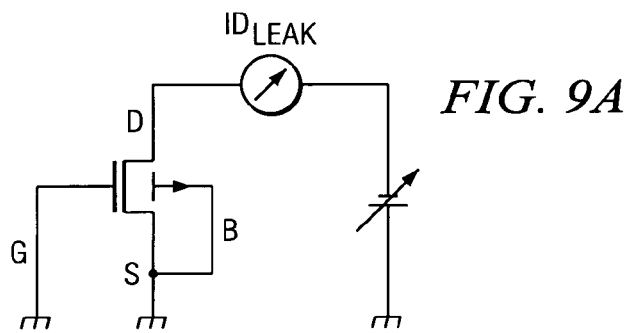
FIG. 9(A) shows the equivalent circuit of the measuring device used in Embodiment Example 1.

FIG. 9(A) shows the equivalent circuit of the measuring device. The voltage on gate G, substrate B, and source S was kept at 0 V, while the drain voltage VD applied to drain D was varied.

Figure 9B:
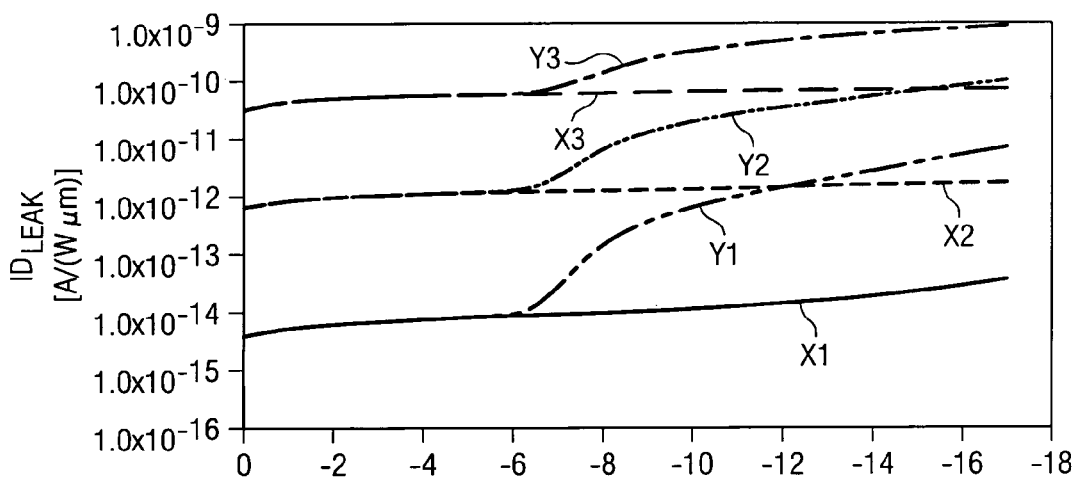
FIG. 9(B) shows the measurement results.

FIG. 9(B) shows the results of the aforementioned measurement. The abscissa represents the drain voltage VD, and the ordinate axis represents the drain leaking current $ID_{LEAK}$. The figure shows the results measured at X1 (measurement temperature: 25° C.), X2 (measurement temperature: 75° C.), and X3 (measurement temperature: 125° C.).

For comparison, a conventional p-channel type MOS transistor with a high breakdown voltage was manufactured, and the drain leaking current was measured in the same way. The results are shown in FIG. 9(B). The figure shows the results measured at Y1 (measurement temperature: 25° C.), Y2 (measurement temperature: 75° C.), and Y3 (measurement temperature: 125° C.).

As can be seen from FIG. 9(B), compared with the conventional example, the p-channel type MOS transistor with a high breakdown voltage disclosed in the present invention can reduce the drain leaking current by two orders of magnitude at room temperature (25° C.) and drain voltage VD=−16.5 V.

EMBODIMENT EXAMPLE 2

A semiconductor device was manufactured by connecting two MOS transistors with high breakdown voltages by the low concentration impurity areas in series in the same way as described in the second embodiment, and the on characteristic was measured. The interval between the gate electrodes of the two MOS transistors with high breakdown voltages was 0.5 μm.

Also, as a comparative example with an insignificant effect caused by a parasitic coupling field effect transistor, a semiconductor device having a high concentration impurity area formed in the region where the two MOS transistors with high breakdown voltages are connected and having the interval between the gate electrodes of the two MOS transistors set to 1.5 μm was manufactured in the same way, and the on characteristic was also measured.

For comparison, conventional semiconductor devices with two MOS transistors with high breakdown voltages connected in series by the low concentration impurity areas were manufactured with the interval between the gate electrodes set as 0.5 μm and 1.5 μm. The on characteristics were measured in the same way.

Figure 10A:
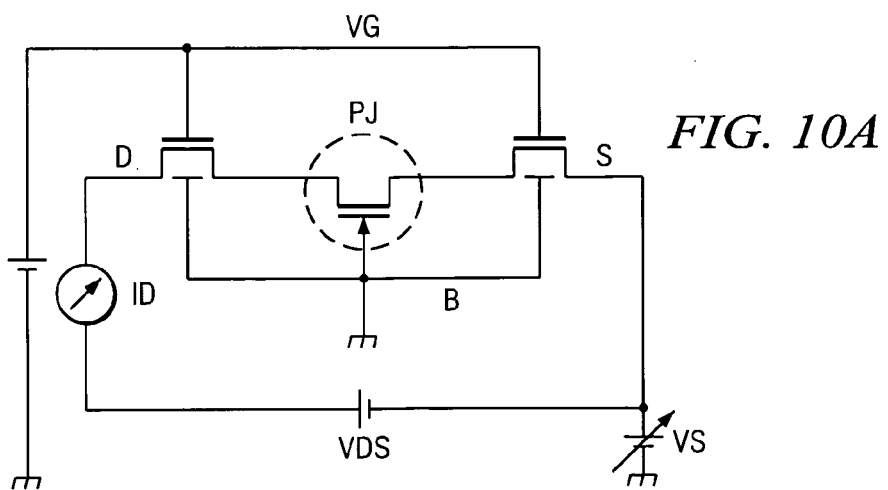
FIG. 10(A) shows the equivalent circuit of the measuring device used in Embodiment Example 2.

FIG. 10(A) shows the equivalent circuit of the measuring device. The voltage on substrate B was set to 0 V, the gate voltage VG was set to 10 V, 16.5 V, 23 V, and the drain-source voltage VDS was set to 0.1 V. The drain voltage VD and the source voltage VS were varied.

Figure 10B:
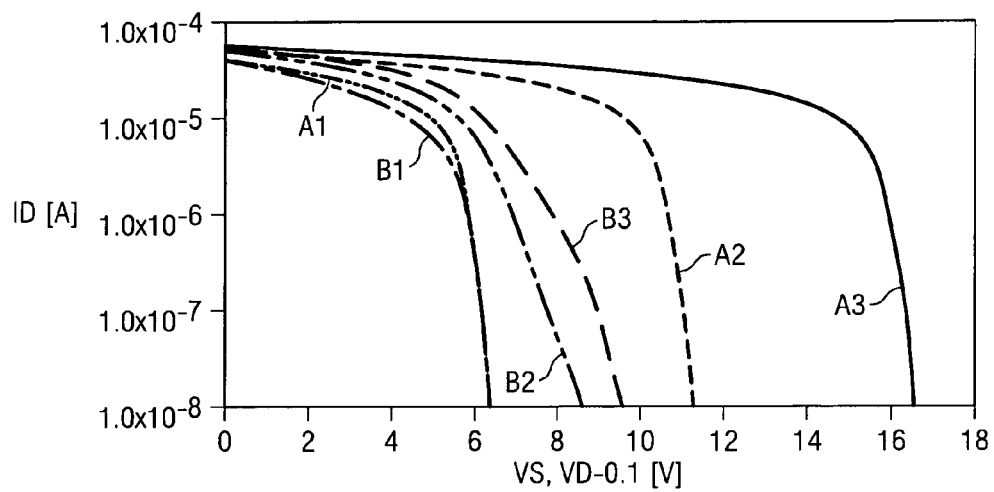
FIGS. 10(B) and 10(C) show the measurement results.

FIG. 10(B) shows the measurement results of the conventional semiconductor devices. The abscissa represents the source voltage VS (drain voltage VD: −0.1 V), and the ordinate axis represents the drain current ID. The measurement results displayed at A1 (gate voltage VG: 10 V), A2 (gate voltage: 16.5 V), A3 (gate voltage: 23 V) represent an interval between the gate electrodes of 1.5 μm. Also, the measurement results displayed at B1 (gate voltage VG: 10 V), B2 (gate voltage: 16.5 V), B3 (gate voltage: 23 V) represent an interval between the gate electrodes of 0.5 μm.

Compared with the case with an insignificant effect caused by a parasitic coupling field effect transistor in which the interval between the gate electrodes is 1.5 μm, in the conventional example, when the interval between the gate electrodes is reduced to 0.5 μm and under the condition of VG=16.5 V, the on current at lower source voltages decreases sharply, and the cutoff source voltage (near 0.1 μA) drops.

Figure 10C:
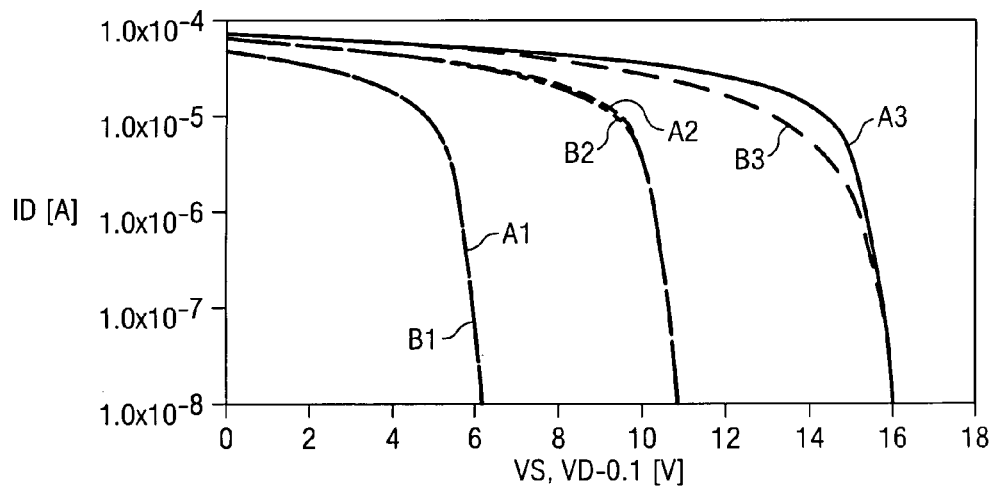

FIG. 10(C) shows the measurement results of the semiconductor device of the present invention. The measurement results displayed at A1 (gate voltage VG: 10 V), A2 (gate voltage: 16.5 V), A3 (gate voltage: 23 V) represent an interval between the gate electrodes of 1.5 μm. Also, the measurement results displayed at B1 (gate voltage VG: 10 V), B2 (gate voltage: 16.5 V), B3 (gate voltage: 23 V) represent an interval between the gate electrodes of 0.5 μm.

In the present invention, even if the interval between the electrodes is reduced to 0.5 μm, the electric characteristics are not inferior to those in the case with an insignificant effect caused by a parasitic coupling field effect transistor in which the interval between the gate electrodes is 1.5 μm, and the cutoff source voltage (near 0.1 μA) has almost no change.

EMBODIMENT EXAMPLE 3

The on resistance was measured for the semiconductor devices used in Embodiment Example 2 (a device according to the present invention with the interval between the gate electrodes set to 0.5 μm, a device according to the present invention with the interval between the gate electrodes set to 1.5 μm, a conventional device with the interval between the gate electrodes set to 0.5 μm, and a conventional device with the interval between the gate electrodes set to 1.5 μm).

Figure 11A:
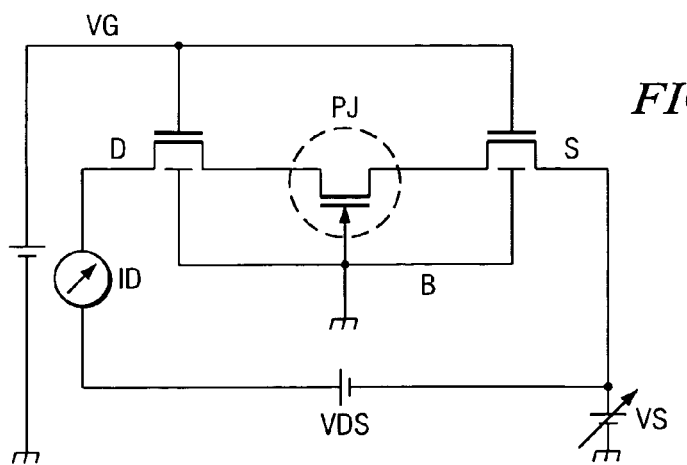
FIG. 11(A) shows the equivalent circuit of the measuring device used in Embodiment example 3.

FIG. 11(A) shows the equivalent circuit of the measuring device. The voltage on substrate B was set to 0 V, the gate voltage VG was set to 10 V, 16.5 V, 23 V, and the drain-source voltage VDS was set to 0.1 V. The drain voltage VD and the source voltage VS were varied.

Figure 11B:
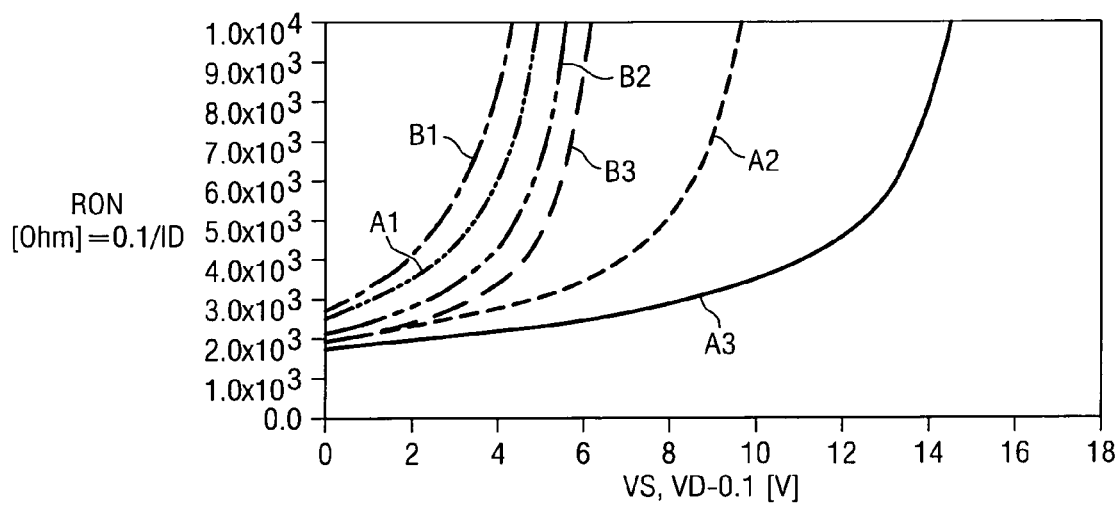
FIGS. 11(B) and 11 (C) show the measurement results.

FIG. 11(B) shows the measurement results of the conventional semiconductor devices. The abscissa represents the source voltage VS (drain voltage VD–0.1 V) and the ordinate axis represents the on resistance (VDS/ID). The measurement results displayed at A1 (gate voltage VG: 10 V), A2 (gate voltage: 16.5 V), A3 (gate voltage: 23 V) represent an interval between the gate electrodes of 1.5 μm. Also, the measurement results displayed at B1 (gate voltage VG: 10 V), B2 (gate voltage: 16.5 V), B3 (gate voltage: 23 V) represent an interval between the gate electrodes of 0.5 μm.

Compared with the case of an insignificant effect caused by a parasitic coupling field effect transistor in which the interval between the gate electrodes is 1.5 μm, in the conventional example, when the interval between the gate electrodes is reduced to 0.5 μm, the on resistance tends to increase.

Figure 11C:
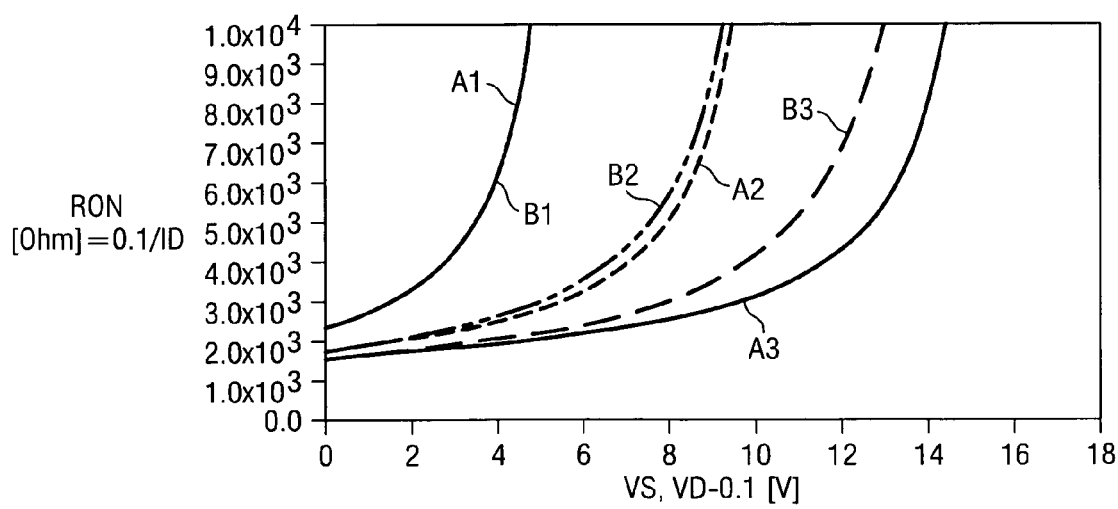
Figure 12:
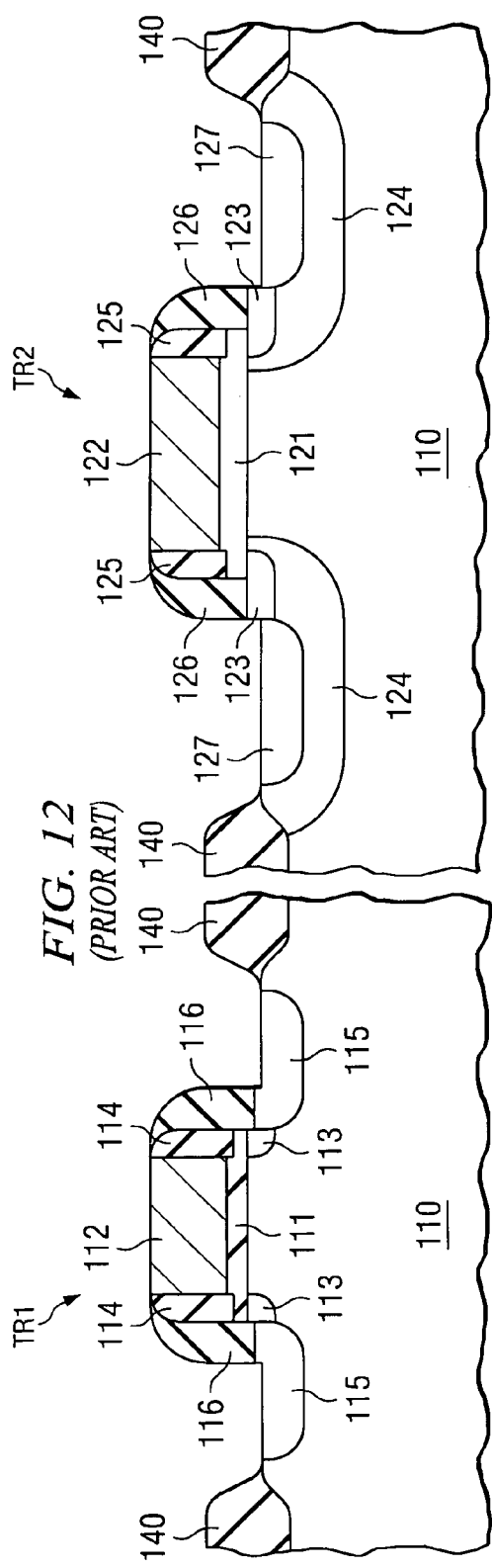
FIG. 12 is a cross-sectional view illustrating a conventional semiconductor device.
Figure 13B:
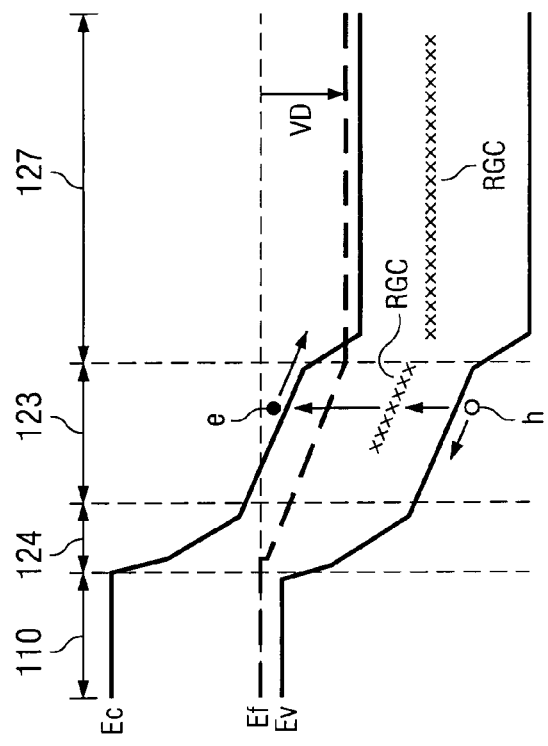
FIG. 13(B) is a schematic diagram illustrating the energy band in the channel direction of the cross section shown in FIG. 13(A).
Figure 13A:
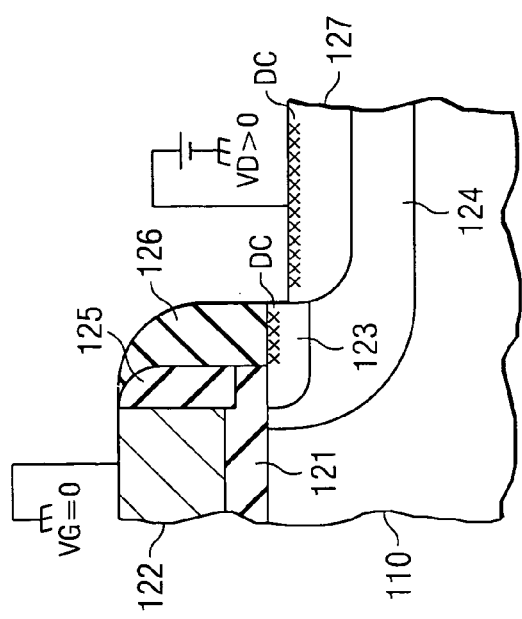
FIG. 13(A) is a schematic cross-sectional view illustrating the expanded source-drain area of the MOS transistor with a high breakdown voltage in the first conventional example.
Figure 14A:
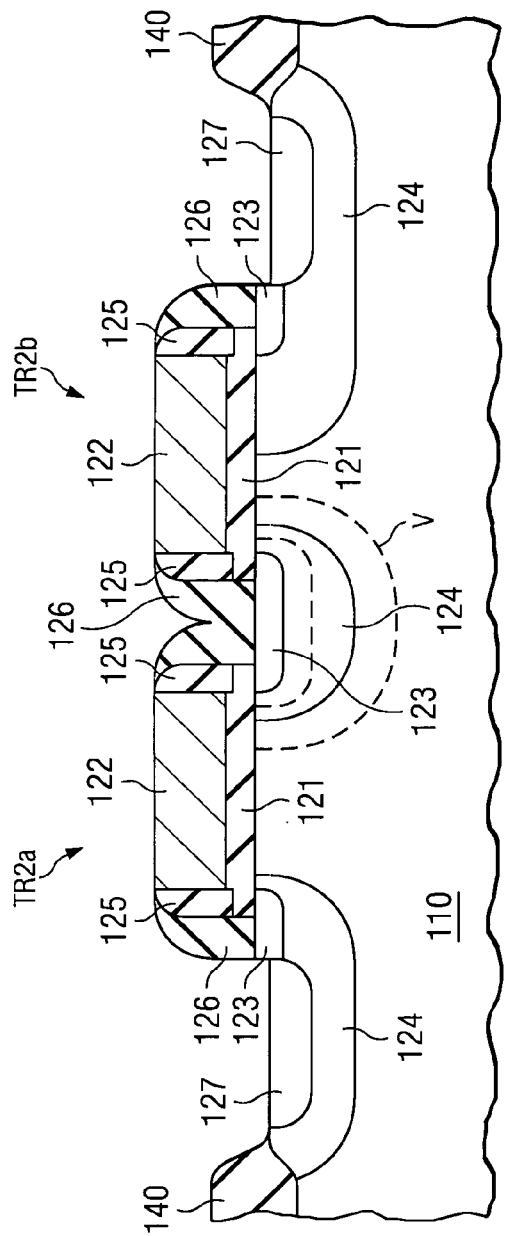
FIG. 14(A) is a cross-sectional view illustrating the second conventional semiconductor device.
Figure 14B:
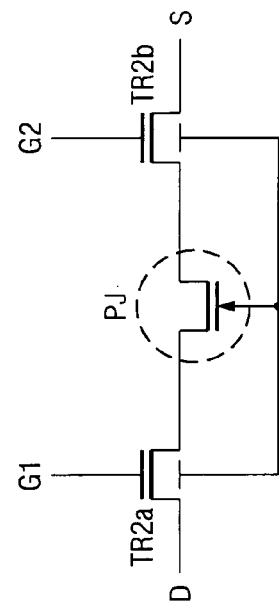
FIG. 14(B) shows its equivalent circuit.

FIG. 11(C) shows the measurement results of the semiconductor device of the present invention. The measurement results displayed at A1 (gate voltage VG: 10 V), A2 (gate voltage: 16.5 V), A3 (gate voltage: 23 V) represent an interval between the gate electrodes of 1.5 μm. Also, the measurement results displayed at B1 (gate voltage VG: 10 V), B2 (gate voltage: 16.5 V), B3 (gate voltage: 23 V) represent an interval between the gate electrodes of 0.5 μm.

In the present invention, even if the interval between the electrodes is reduced to 0.5 μm, the electric characteristics are not inferior to those in the case with an insignificant effect caused by a parasitic coupling field effect transistor in which the interval between the gate electrodes is 1.5 μm, and no resistance increase due to the parasitic coupling field effect transistor is observed.

The present invention is not limited to the embodiments described above.

For example, n-channel transistors are explained in the embodiments. However, the present invention can also be applied to p-channel transistors by replacing the n-type impurity with a p-type impurity. The present invention can also be applied to CMOS devices using n-channel transistors and p-channel transistors. Also, the concentrations in the low concentration impurity area and the high concentration impurity area can be set to the levels suitable for these transistors.

In the first embodiment, when forming the first inner sidewall insulation film 14, the first gate insulation film 11 positioned on the outer is removed completely to expose the main surface of p-type semiconductor substrate 10. However, it is also possible not to completely remove the first gate insulation film 11 and to leave the first gate insulation film 11 underneath the first outer sidewall insulation film 16.

The source-drain area can adopt a configuration having an LDD diffused layer, a configuration having a DDD diffused layer, or a configuration having a pocket layer for pinch through control.

Various types of modifications can be made as long as they do not deviate from the main concept of the present invention.

For the semiconductor device of the present invention, since the semiconductor substrate is not exposed and the surface layer is not removed after the etching performed to form the inner sidewall insulation film, negative effects on the electric characteristics, such as an increase of the drain leakage and a decrease of the cutoff source voltage in the series-connected configuration, can be inhibited.

In the semiconductor device manufacturing method of the present invention, since the semiconductor substrate is not exposed and the surface layer is not removed after the etching performed to form the inner sidewall insulation film, negative effects on the electric characteristics, such as an increase of the drain leakage and a decrease of the cutoff source voltage in the series-connected configuration, can be inhibited.

The invention claimed is:

1. A semiconductor device comprising:
a first transistor formed in a semiconductor substrate of a first conductivity type, wherein the first transistor comprises:
a first channel creation area located in said semiconductor substrate,
a first gate insulation film formed on said semiconductor substrate over the first channel creation area,
a first gate electrode formed on said first gate insulation film,
a first inner sidewall insulation film formed on both sides of the first gate electrode,
a first outer sidewall insulation film formed adjacent the first inner sidewall insulation film, wherein said first outer sidewall insulation film is located directly on the semiconductor substrate,
a first lightly doped area that contains an impurity of the second conductivity type at a low concentration and is located adjacent to said first channel creation area in said semiconductor substrate underneath said first inner sidewall insulation film,
a first heavily doped area that contains an impurity of the second conductivity type at a higher concentration than said first lightly doped area and is located adjacent to said first lightly doped area in said semiconductor substrate underneath the first outer sidewall insulation film and in the areas bordering said first outer sidewall insulation film; and
a second transistor formed in the semiconductor substrate and having a different breakdown voltage than said first transistor, wherein said second transistor comprises:
a second channel creation area formed in the semiconductor substrate,
a second gate insulation film formed on the semiconductor substrate over the second channel creation area,
a second gate electrode formed on the second gate insulation film,
a second inner sidewall insulation film that is formed at least on part of the second gate insulation film and on both sides of the second gate electrode,
a second outer sidewall insulation film that is formed at least partially on and in direct contact with a top surface of the second gate insulation film and adjacent the second inner sidewall insulation film,
a second lightly doped area that contains an impurity of the second conductivity type at a low concentration and is located adjacent to the second channel creation area in the semiconductor substrate underneath the second inner sidewall insulation film and the second outer sidewall insulation film,
a second heavily doped area that contains an impurity of the second conductivity type at a higher concentration than the second lightly doped area and is located adjacent to the second lightly doped area in the semiconductor substrate.

2. The semiconductor device described in claim 1 wherein the second transistor further comprises a third lightly doped area that contains the impurity of the second conductivity type at a lower concentration than in the second lightly doped area and in its proper configuration, it is deeper than the second lightly doped area and the second heavily doped area and it extends into the second channel creation area farther than the end of the second lightly doped area on the side of the second channel creation area.

3. A semiconductor device comprising:
a first transistor formed in a semiconductor substrate of a first conductivity type, wherein the first transistor comprises:
a first channel creation area located in said semiconductor substrate,
a first gate insulation film formed on said semiconductor substrate over the first channel creation area,
a first gate electrode formed on said first gate insulation film,
a first inner sidewall insulation film formed on both sides of the first gate electrode,
a first outer sidewall insulation film formed adjacent the first inner sidewall insulation film, wherein said first outer sidewall insulation film is located directly on the semiconductor substrate,
a first lightly doped area that contains an impurity of the second conductivity type at a low concentration and is located adjacent to said first channel creation area in said semiconductor substrate underneath said first inner sidewall insulation film,
a first heavily doped area that contains an impurity of the second conductivity type at a higher concentration than said first lightly doped area and is located adjacent to said first lightly doped area in said semiconductor substrate underneath the first outer sidewall insulation film and in the areas bordering both sides of said first outer sidewall insulation film; and
a second transistor formed in the semiconductor substrate and having a different breakdown voltage than said first transistor, wherein said second transistor comprises:
a second channel creation area formed in the semiconductor substrate,
a second gate insulation film formed on the semiconductor substrate over the second channel creation area,
a second gate electrode formed on the second gate insulation film,
a second inner sidewall insulation film that is formed at least on part of the second gate insulation film and on both sides of the second gate electrode,
a second outer sidewall insulation film that is formed at least partially on and in direct contact with a top surface of the second gate insulation film and adjacent the second inner sidewall insulation film,
a second lightly doped area that contains an impurity of the second conductivity type at a low concentration and is located adjacent to the second channel creation area in the semiconductor substrate underneath the second inner sidewall insulation film and the second outer sidewall insulation film,
a second heavily doped area that contains an impurity of the second conductivity type at a higher concentration than the second lightly doped area and is located adjacent to the second lightly doped area in the semiconductor substrate,
at least two transistors connected in series, both of said at least two transistors having the same configuration as the second transistor, wherein the second outer sidewall insulation film of a first of the two transistors contacts the second outer sidewall insulation film of the second of the two transistors.

4. The semiconductor device described in claim 3 wherein the two transistors are connected to each other by the second lightly doped area.

5. A method for manufacturing a semiconductor device having a first transistor and a second transistor with different breakdown voltages, comprising the steps of:
forming a first gate insulation film on a first channel creation area of a semiconductor substrate of a first conductivity type;
forming a second gate insulation film on a second channel creation area of the semiconductor substrate;
forming a first gate electrode on the first gate insulation film and a second gate electrode on the second gate insulation film;
in a first transistor fabrication area, implanting an impurity of a second conductivity type at a low concentration into the semiconductor substrate using the first gate electrode as a mask to form a first lightly doped area that is adjacent to the first channel creation area;
in a second transistor fabrication area, implanting an impurity of a second conductivity type at a low concentration into the semiconductor substrate using the second gate electrode as a mask to form a second lightly doped area that is adjacent to the second channel creation area;
forming a first inner sidewall insulation film on both sides of the first gate electrode and a second inner sidewall insulation film on at least part of the second gate insulation film and on both sides of the second gate electrode;
in said first transistor fabrication area, implanting an impurity of the second conductivity type at a high concentration into the semiconductor substrate with the first inner sidewall insulation film used as a mask to form a first heavily doped area that is adjacent to the first lightly doped area;
forming a first outer sidewall insulation film on both sides of the first inner sidewall insulation film and a second outer sidewall insulation film on at least part of the second gate insulation film and on both sides of the second inner sidewall insulation film;
in the second transistor fabrication area, implanting an impurity of the second conductivity type at a high concentration into the semiconductor substrate with the second inner sidewall insulation film and the second outer sidewall insulation film used as a mask to form a second heavily doped area that is adjacent to the second lightly doped area; and
wherein the step for forming the first inner sidewall insulation film and the second inner sidewall insulation film includes an etching step, which ends at the time when at least part of the second gate insulation film remains on both sides of the second inner sidewall insulation film and the first gate insulation film is completely removed from both sides of the first inner sidewall insulation film.

6. The method described in claim 5 further comprising the step of before the step for forming the first inner sidewall insulation film and the second inner sidewall insulation film, in the second transistor fabrication area, implanting an impurity of the second conductivity type into the semiconductor substrate at an angle to the semiconductor substrate with the second gate electrode used as a mask to form a third lightly doped area, which has a lower concentration than the second lightly doped area and which is deeper than the second lightly doped area and which extends into the second channel creation area farther than the end of the second lightly doped area on the side of the second channel creation area.

* * * * *